(12) United States Patent
Allen et al.

(10) Patent No.: US 7,404,159 B2
(45) Date of Patent: Jul. 22, 2008

(54) CRITICAL AREA COMPUTATION OF COMPOSITE FAULT MECHANISMS USING VORONOI DIAGRAMS

(75) Inventors: Robert J. Allen, Jericho, VT (US); Evanthia Papadopoulou, New York, NY (US); Mervyn Yee-Min Tan, S. Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/538,913

(22) Filed: Oct. 5, 2006

(65) Prior Publication Data

US 2007/0256040 A1 Nov. 1, 2007

Related U.S. Application Data

(63) Continuation of application No. 10/709,293, filed on Apr. 27, 2004, now Pat. No. 7,143,371.

(51) Int. Cl.
*G06F 17/50* (2006.01)
(52) U.S. Cl. ................................. 716/4; 716/1; 716/7
(58) Field of Classification Search ............... 716/1, 716/4, 7
See application file for complete search history.

(56) References Cited

U.S. PATENT DOCUMENTS

| 6,178,539 | B1 * | 1/2001 | Papadopoulou et al. ......... 716/7 |
| 6,202,181 | B1 * | 3/2001 | Ferguson et al. ............ 714/724 |
| 6,247,853 | B1 | 6/2001 | Papadopoulou et al. |
| 6,317,859 | B1 | 11/2001 | Papadopoulou et al. |
| 6,738,954 | B1 | 5/2004 | Allen et al. |
| 6,948,141 | B1 * | 9/2005 | Satya et al. ..................... 716/4 |
| 7,143,371 | B2 * | 11/2006 | Allen et al. ..................... 716/4 |
| 7,260,790 | B2 * | 8/2007 | Allen et al. ..................... 716/2 |
| 2001/0003427 | A1 * | 6/2001 | Ferguson et al. ............ 324/765 |
| 2002/0156550 | A1 * | 10/2002 | Langford .................... 700/110 |
| 2004/0096092 | A1 | 5/2004 | Ikeda |
| 2005/0021234 | A1 | 1/2005 | Han |
| 2005/0108669 | A1 * | 5/2005 | Shibuya ........................ 716/9 |
| 2005/0168731 | A1 | 8/2005 | Shibuya et al. |
| 2005/0172247 | A1 | 8/2005 | Allen et al. |
| 2005/0240839 | A1 * | 10/2005 | Allen et al. ................. 714/724 |
| 2006/0150130 | A1 | 7/2006 | Papadopoulou et al. |

OTHER PUBLICATIONS

Papadopoulou et al., "Critical Area Computation Via Voronoi Diagrams," IEEE Trans. Computer Aided Design, vol. 18, pp. 463-474, 1999.

Papadopoulou et al., "Critical Area Computation For Missing Material Defects in VLSI Circuits," IEEE Trans. Trans. Semiconduct. Manufact., vol. 20, pp. 583-597, 2001.

(Continued)

*Primary Examiner*—Paul Dinh
*Assistant Examiner*—Suchin Parihar
(74) *Attorney, Agent, or Firm*—Gibb & Rahman, LLC; Richard M. Kotulak, Esq.

(57) ABSTRACT

Disclosed is a method that determines critical areas associated with different types of fault mechanisms in an integrated circuit design. The invention does this by constructing individual Voronoi diagrams for critical areas of individual fault mechanisms and a composite Voronoi diagram based on the individual Voronoi diagrams. The invention computes the critical area for composite fault mechanisms of the integrated circuit design based on the composite Voronoi diagram.

13 Claims, 5 Drawing Sheets

OTHER PUBLICATIONS

Papadopoulou et al., "Critical Area Computation- A New Approach," Proc. International Symposium on Physical Design, pp. 89-94, 1998.

Heng et al., "VLSI Yield Enhancement Techniques Through Layout Modification", IBM T.J. Watson Research Center, pp. 1-15, 2000.

Venkataraman et al., "Trade-Offs Between Yield and Reliability Enhancement", Proc. Of 1996 IEEE National Symp. On Defect and Fault Tolerance in VLSI Systems, pp. 67-75, 1996.

* cited by examiner

CRITICAL AREA COMPUTATION OF COMPOSITE FAULT MECHANISMS USING VORONOI DIAGRAMS

CROSS REFERENCE TO RELATED APPLICATIONS

The present application is a continuation of U.S. patent application Ser. No. 10/709,293, filed on Apr. 27, 2004 now U.S. Pat. No. 7,143,371 to Allen et al., entitled "Critical Area Computation of Composite Fault Mechanisms Using Voronoi Diagrams". The foregoing application is assigned to the present assignee, and is incorporated herein by reference.

BACKGROUND OF INVENTION

1. Field of the Invention

The present invention generally relates to determining critical area in integrated circuit designs and more particularly to an improved methodology of computing critical area for composite fault mechanisms.

2. Description of the Related Art

Critical area of a very large scale integration (VLSI) layout is a measure that reflects the sensitivity of the layout to defects occurring during the manufacturing process. Critical area is widely used to predict the yield of a VLSI chip. Yield prediction is essential in today's VLSI manufacturing due to the growing need to control cost. Models for yield estimation are based on the concept of critical area which represents the main computational problem in the analysis of yield loss due to random (spot) defects during fabrication. Spot defects are caused by particles such as dust and other contaminants in materials and equipment and are classified into two types: "extra material" defects causing shorts between different conducting regions and "missing material" defects causing open circuits.

In some defect modeling techniques, defects are modeled, consistently, as circles. The underlying reason for modeling defects as circles is the common use of Euclidean geometry. The distance between two points, usually, is measured by the length of the line segment joining the two points. This is the Euclidean distance. The locus of points a unit distance from a center point is usually called the "unit circle". In Euclidean geometry, the "unit circle" is a circle of radius one.

In reality, spot defects are not necessarily circular. They can have any kind of shape. Therefore, it seems appropriate to use other geometries if the critical area computation can be simplified by modeling defects as squares, diamonds or octagons, respectively. For practical purposes, a circular defect can certainly be approximated by a regular octagon. Yield estimation should not considerably depend on which of the above geometries is used to model defects as long as the geometry is chosen consistently. Therefore, the geometry used for a particular computation, preferably, should allow critical area computation in the most efficient way.

A Voronoi diagram can also be used to enhance the computation of critical area. A Voronoi diagram of a set of 2D geometric elements (polygons, line segments, points) is a partition of the plane into regions representing those points on the plane closest to a particular geometric element. Here, "closest" is defined in terms of an appropriate geometry as mentioned above. These regions are called Voronoi cells, each of which is associated with its defining geometric element, called the owner of the cell. The set of points which separates two Voronoi cells is called a Voronoi bisector. The point where three or more Voronoi bisectors (or Voronoi cells) meet is called a Voronoi vertex.

Based on the circuit design and under an appropriate geometry, Voronoi diagrams can be constructed to model the effect of extra-material and missing-material spot defects. The Voronoi diagram partitions the circuit design into Voronoi cells within which defects that occur cause electrical faults between the same two shape edges in the design. This information can then be used to compute critical area. (e.g., see U.S. Pat. Nos. 6,317,859, 6,247,853, and 6,178,539, which are incorporated herein by reference).

SUMMARY OF INVENTION

The invention provides a method of determining critical areas associated with different types of defect mechanisms in an integrated circuit design. The invention first extracts the generators of the Voronoi diagrams for each given defect mechanism and then constructs a composite Voronoi diagram based on these generators. Generators are the geometric entities from which distance is measured within the diagram. From the composite Voronoi diagram, the invention computes the critical area for composite fault mechanisms of the integrated circuit design.

The composite-OR Voronoi diagram is the minimum of the individual Voronoi diagrams in its three-dimensional representation of distance. The composite Voronoi diagram also represents the logical OR of the individual fault mechanisms.

The invention computes the critical area of the logical OR of the individual fault mechanisms based on the composite Voronoi diagram. The invention computes the critical area of the logical AND of fault mechanisms by adding the critical areas of the first individual fault mechanism to the second individual fault mechanism to produce an intermediate result, and then subtracting the critical area of the logical OR of those fault mechanisms from this intermediate result to produce a final result. The invention computes the critical area of the logical NOT of a fault mechanism by subtracting the critical area of the fault mechanism from the area of the integrated circuit. The invention further computes the critical area for any boolean expression of independent fault mechanisms as sums and differences of the above atomic operations.

These, and other, aspects and objects of the present invention will be better appreciated and understood when considered in conjunction with the following description and the accompanying drawings. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF DRAWINGS

The invention will be better understood from the following detailed description with reference to the drawings, in which.

DETAILED DESCRIPTION

Figure 1:
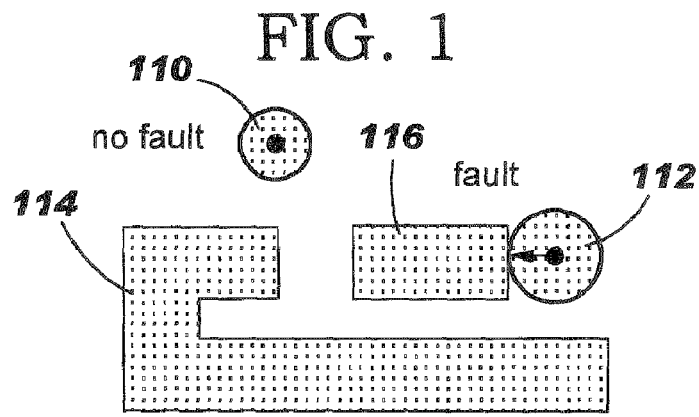
FIG. 1 is a schematic diagram illustrating a fault mechanism.

The present invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

Critical area is used to predict of the loss of yield of a chip due to random defects and is a function of a particular fault mechanism. A fault mechanism is defined as the manner in which a random defect causes a type of fault based on a triggering layout edge. A fault is defined as an electrical disruption to the operation of a chip caused by the occurrence of a random defect.

One example of an individual fault mechanism is shown in FIG. 1. The design includes conductive features 114, 116. Items 110 and 112 represent foreign matter particles. Item 112 creates a fault because it touches conductive feature 116. This type of fault is referred to as a "touch" fault because the particle touch the conductive shape to cause the fault.

Figure 2:
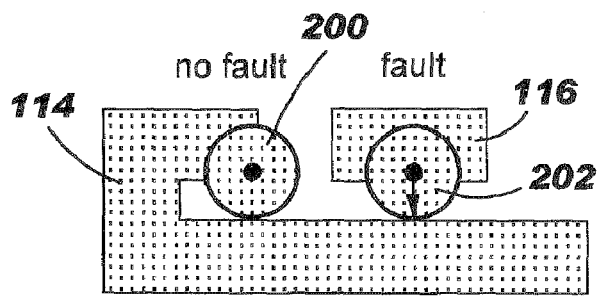
FIG. 2 is a schematic diagram illustrating a fault mechanism.

However, with some individual fault mechanisms particles can touch a conductive feature without causing a fault, as shown in FIG. 2. More specifically, the particle 200 does not cause a fault even though it touches conductive feature 114. This is because the type of fault shown in FIG. 2 is a "shorts" type fault, which occurs when the particle causes a short circuit between different nets. In this case, particle 200 does not cause a fault because it does not create a short circuit between two different nets, but instead causes a short circuit within a single net 114. To the contrary, particle 202 does create a short circuit between feature 116 and 114. Therefore, particle 202 is identified as a fault for the "shorts" type fault.

Figure 3:
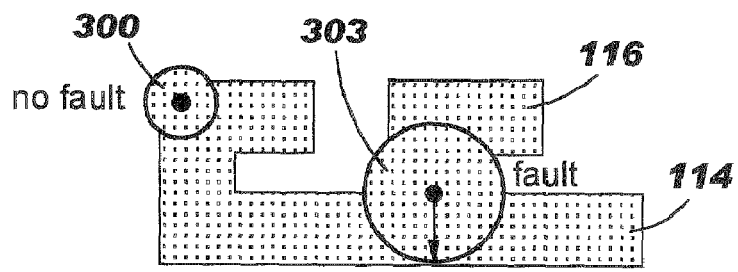
FIG. 3 is a schematic diagram illustrating a fault mechanism.

FIG. 3 illustrates an "opens" type fault which occurs when there is a break in a wire. Particle 300 does not cause this type of fault because it does not completely cross wire 114. Instead, particle 303 completely breaks item 114 and therefore, creates an opens fault.

Figure 4:
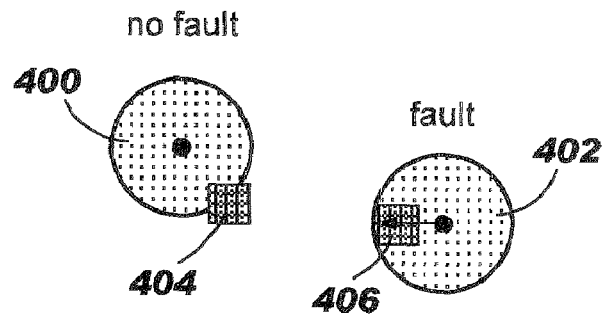
FIG. 4 is a schematic diagram illustrating a fault mechanism.

FIG. 4 illustrates a "via block" type fault which exists when a particle blocks a via or contact. More specifically, items 404, 406 represent vias. Particle 400 does not completely block via 404, while fault 402 blocks via 406. Therefore, particle 400 does not create a via block fault while particle 402 does.

Figure 5:
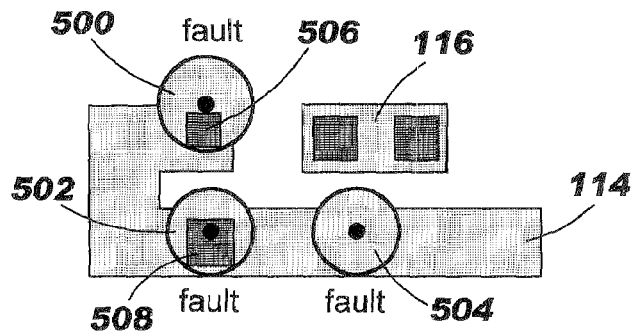
FIG. 5 is a schematic diagram illustrating a fault mechanism.

A composite fault mechanism is defined as one in which faults are dependent on the occurrence of two or more independent faults. FIGS. 5-8 illustrate some composite-type faults. More specifically, FIG. 5 illustrates an "opens with contacts" type fault. Therefore, this type of fault mechanism identifies both types of faults, both particles that cause opens and particles that blocked contacts. Thus, particles 502 and 504 cause faults because they create an "open" fault in feature 114 and particles 500 and 502 cause a fault by blocking the vias 506, 508. Note that particle 502 causes both types of faults.

Figure 6:
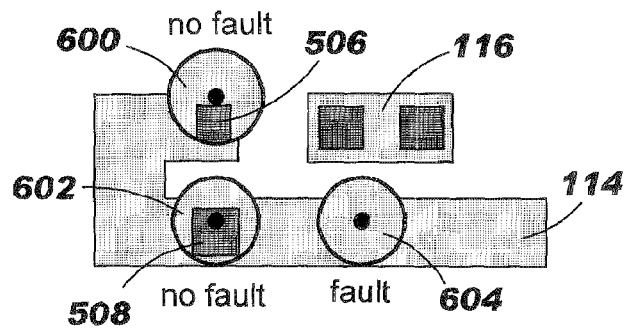
FIG. 6 is a schematic diagram illustrating a fault mechanism.

FIG. 6 is substantially identical to FIG. 5; however, the type of fault mechanism in FIG. 6 is referred to an "isolated opens" which considers a particle to be a fault only for an open fault that does not cause any contact-type fault. Therefore, only particle 604 causes a fault, because particles 600 and 602 are also involved with contact-type faults.

Figure 7:
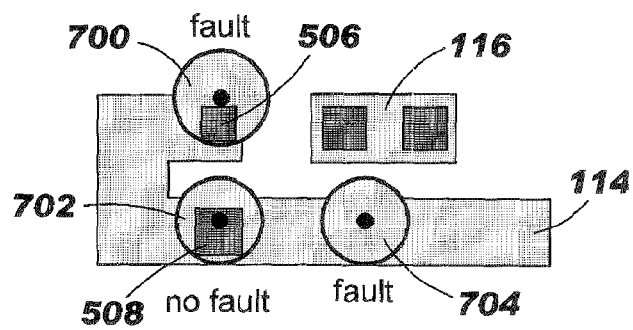
FIG. 7 is a schematic diagram illustrating a fault mechanism.

Again, FIG. 7 is substantially identical to FIG. 5; however, the fault mechanism in FIG. 7 is referred to as "isolated opens and blocks." This type of fault mechanism identifies faults that cause opens with out blocking a via and via blocks that did not cause an open. In a situation, particle 700 blocks via 506 but does not create an open in item 114 and is therefore a fault. Item 704 is a fault because as it creates an open in item 114 but does not block a via.

Figure 8:
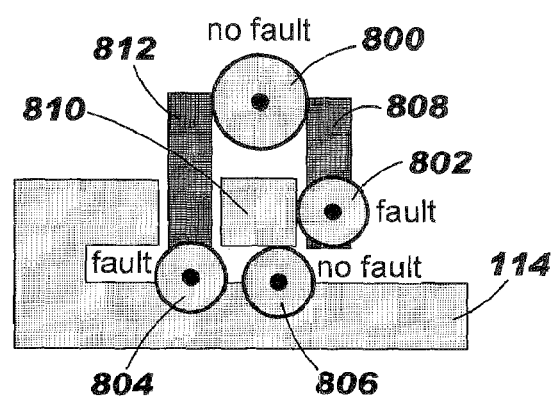
FIG. 8 is a schematic diagram illustrating a fault mechanism.

FIG. 8 illustrates a 2-level short mechanism which identifies short circuits between wires on one level 812, 808 and wires on a different level 114, 810. Item 804 creates a fault by shorting item 812 to item 114. Similarly, particle 802 creates a fault by shorting item 808 to item 810. Particles 800 and 806 do not create a short circuit between levels, but instead create short circuits between items on the same level and therefore do not result in this type of defect.

As shown in greater detail below, the invention computes the critical area of composite fault mechanisms in an integrated circuit design. The invention does this by first defining a composite Voronoi diagram based on the Voronoi diagram for critical area of the individual fault mechanisms in the composite mechanism. Then the invention computes critical area based on this composite Voronoi diagram.

The invention constructs the composite Voronoi diagram for the logical OR of fault mechanisms by mapping the minimum values of the individual Voronoi diagrams associated with each mechanism. The invention constructs the composite Voronoi diagram for the logical AND of fault mechanisms by mapping the maximum values of the individual Voronoi diagrams associated with each mechanism. Through mathematical integration over the three-dimensional surface these composite Voronoi diagrams represent, the invention computes the critical area associated with composite fault mechanisms formed with the boolean operators OR, AND, or NOT.

The invention alternatively computes the critical area of composite fault mechanisms in an integrated circuit design by the sums and differences of intermediate critical areas involving only the logical-OR of individual fault mechanisms. This is of advantage because an extension of known efficient sweep-line algorithms can be used for the construction of the composite-OR Voronoi diagram associated with the logical-OR of the individual fault mechanisms.

Specifically, the invention computes the critical area of a composite fault mechanism that is the logical—AND of independent fault mechanisms by first adding the critical areas of the individual mechanism to create an intermediate term. Then the invention subtracts the critical area of the logical—OR of the individual mechanisms to obtain the critical area of the logical—AND of those mechanisms. The invention computes the critical area of a composite mechanism that is the logical NOT of a mechanism by subtracting the critical area of the mechanism from the area of the layout. In general, the invention is able to compute the critical area of a composite fault mechanism that is an arbitrary boolean expression over individual independent fault mechanisms. This involves expressing the boolean composition in conjunctive or disjunctive normal form, and then taking the sums and differences of the critical areas of the logical—OR of subsets of these individual mechanisms. The critical area for the logical—OR of each subsets is computed, as described earlier, through the construction of its associated composite—OR Voronoi diagram.

The invention can also be embodied in a program storage device readable by computer that tangibly embodies a program of instructions executable by the computer for performing a method of determining critical areas associated with composite fault mechanisms in an integrated circuit design, as described above.

The following describe how Voronoi diagrams relate to critical area and provides some foundation for the invention.

I. Let A be a fault mechanism.

Let r be the radius of a defect.

Let DefectDensity (r) be the probability distribution of defect sizes for a given fault mechanism. This function is independent of the design of the layout and has the property that $$\int_0^\infty DefectDensity(r)\,dr = 1.$$

Let (x,y) be the smallest size of a defect centered at a location (x,y) in the layout that will cause a fault defined by the given fault mechanism.

II. Then critical area of A is given by an integral over the area of the layout and defect sizes which cause faults defined by A.

$$CriticalArea(A) = \int\int_{Area}\int_{\mu(x,y)}^\infty DefectDensity(r)\,dr\,dx\,dy$$

III. The Voronoi diagram is conceptually a mapping of all points in the layout to the smallest defect size which will cause a fault. The smallest defect size at (x,y) to cause a fault is, incidentally, the distance from (x,y) to the farthest edge in the design among the edges involved in the fault.

$$Voronoi(A):(x,y)\to\mu;\ \mu\in[0,\infty)$$

This mapping is also conceptually a three dimensional surface where the z-axis represents defect sizes $\mu$.

IV. Therefore, $$CriticalArea(A) = \int\int_{Area}\int_{Voronoi(x,y)}^\infty DefectDensity(r)\,dr\,dx\,dy$$

This is conceptually an integration over the volume above the three-dimensional surface that the Voronoi diagram represents.

In other words, the problem of computing the critical area for a particular fault mechanism reduces to constructing the Voronoi diagram for that particular fault mechanism. However, no Voronoi-diagram based computations have yet been described for generalized composite fault mechanisms.

A composite mechanism can be described using the boolean operators AND, OR, and NOT. There exists an intuitive meaning to the use of these operators as seen in the examples of composite fault mechanisms (FIGS. 4-8). Their meaning is quantified for a point (x,y) on the layout as follows.

I. Let R be the set of defect sizes (radius) that causes a fault. The space of all possible defect sizes is given by $$R_\Omega=[0,\infty).$$

Let $\mu_G$ be the critical radius, or the smallest defect size centered at (x,y) that causes a fault in mechanism G. One makes the observation that any larger defect would also cause the same fault. Thus, the set of defect sizes that cause faults is given by $$R_G=[\mu_G,\infty).$$

II. For a composite mechanism A OR B, the defect sizes that cause faults is given by $$R_{A\ OR\ B}=R_A\cup R_B$$

or equivalently $$R_{A\ OR\ B}=[MIN(\mu_A,\mu_B),\infty)$$

IV. For the mechanism A AND B, the defect sizes that cause faults is given by $$R_{A\ AND\ B}=R_A\cap R_B$$

or equivalently $$R_{A\ AND\ B}\in[MAX(\mu_A,\mu_B),\infty)$$

V. For the mechanism NOT A, the defect sizes that cause faults is given by $$R_{NOT\ A}=R_\Omega-R_A$$

or equivalently $$R_{NOT\ A}=[0,\mu_A)$$

VI. The above definitions are based on a single point. These definitions are extended to all points (x,y) in the layout.

VII. There exists a bijective mapping between the boolean operators over fault mechanisms and the logical set operators over the mechanisms" respective sets of defect radii which cause faults.

Based on the previous quantification,

I. Voronoi(A OR B)=MIN(Voronoi(A),Voronoi(B)), the minimum of the Voronoi surfaces associated with A and B along the z-axis. And $$CriticalArea(A\ OR\ B) = \int\int_{Area}\int_{Voronoi_{A\ OR\ B}(x,y)}^\infty DefectDensity(r)\,dr\,dx\,dy,$$

an integration over the volume above the surface of Voronoi(A OR B).

II. Voronoi(A AND B)=MAX(Voronoi(A),Voronoi(B)), the maximum of the Voronoi surfaces with A and B along the z-axis. And $$CriticalArea(A\ AND\ B) = \int\int_{Area}\int_{Voronoi_{A\ AND\ B}(x,y)}^\infty DefectDensity(r)\,dr\,dx\,dy,$$

an integration over the volume above the surface of Voronoi(A AND B).

III. Voronoi(NOT A)=Voronoi(A) and $$CriticalArea(\text{NOT } A) = \int\int_{Area}\int_0^{Voronoi_\lambda(x,y)} DefectDensity(r)\,dr\,dx\,dy,$$

an integration over the volume beneath the surface of Voronoi (NOT A).

Figure 9:
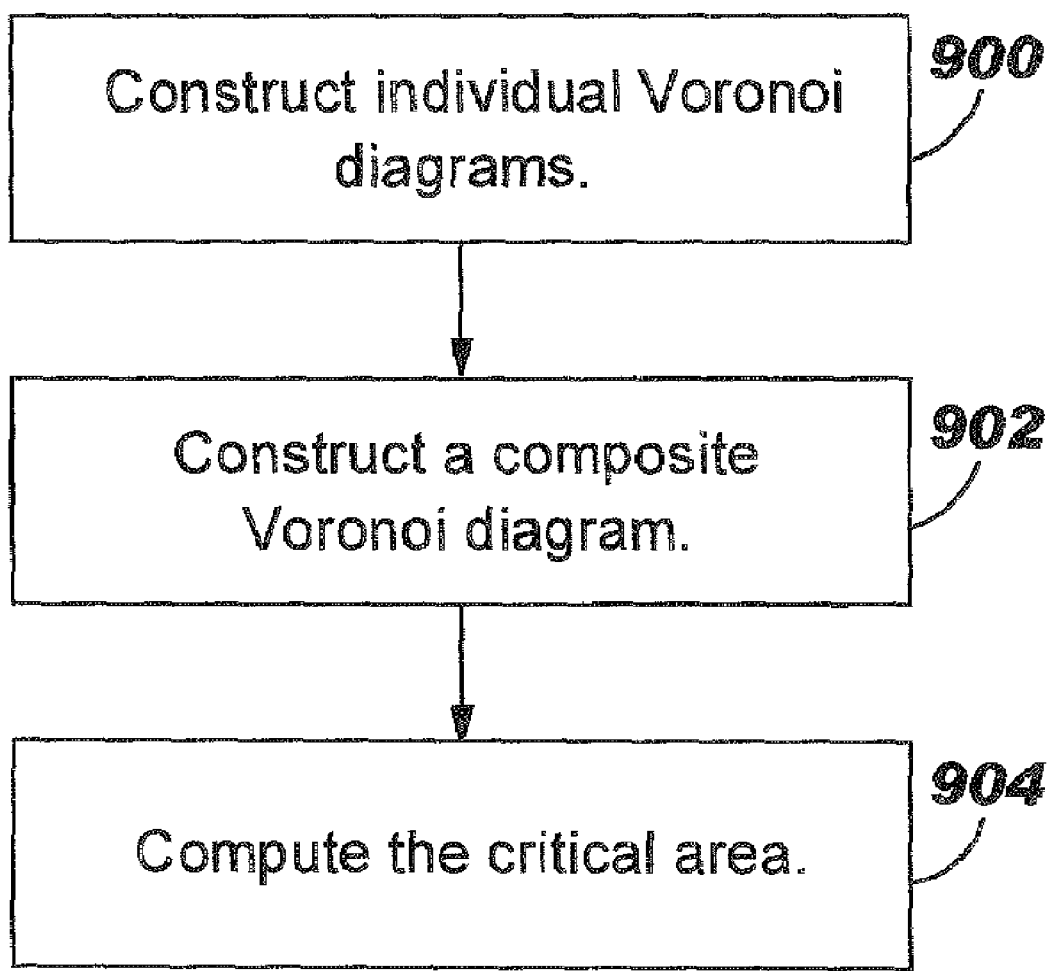
FIG. 9 is a flow diagram illustrating a preferred method of the invention.

Thus, the invention provides a methodology which can be used to compute the Voronoi diagram for any fault mechanism that is the composite of independent fault mechanisms. More specifically, as shown in the flowchart in FIG. 9, the invention provides a method of determining critical areas associated with the composites of independent fault mechanisms. The different types of defect mechanisms are independent of one another. The invention first constructs individual Voronoi diagrams showing critical areas for each different type of defect mechanism of interest 900 and then constructs a composite Voronoi diagram based on the individual Voronoi diagrams 902. From this composite Voronoi diagram, the invention computes the critical area 904 for composite fault mechanisms of the integrated circuit design.

The invention further provides a method for constructing any composite-OR Voronoi diagram efficiently using a sweep-line algorithm. A sweep-line algorithm is compatible because it is based on minimum distances and the composite-OR is the minimum of two or more Voronoi diagrams. This is accomplished in the following manner.

I. Pool into a single set the geometric line segments and polygons which define the component Voronoi diagrams and which are also used in the sweep-line construction (see U.S. Pat. Nos. 6,317,859, 6,247,853, and 6,178,539, which are incorporated herein by reference) of the component Voronoi diagrams.

II. Use the combined set of geometric entities for the sweep-line algorithm to generate the composite-OR Voronoi diagram.

III. Within the execution of the algorithm in step II, maintain a wavefront (see description of the sweep-line algorithm in reference) that is formed from those sets of points closest to the sweep-line among the wavefronts used in the sweep-line construction of the component Voronoi diagrams. Call this the composite wavefront.

IV. Maintenance of the composite wavefront in III is accomplished by scheduling events to keep track of potential bisectors which are not part of the composite wavefront but may penetrate the composite wavefront and become part of it.

Figure 10:
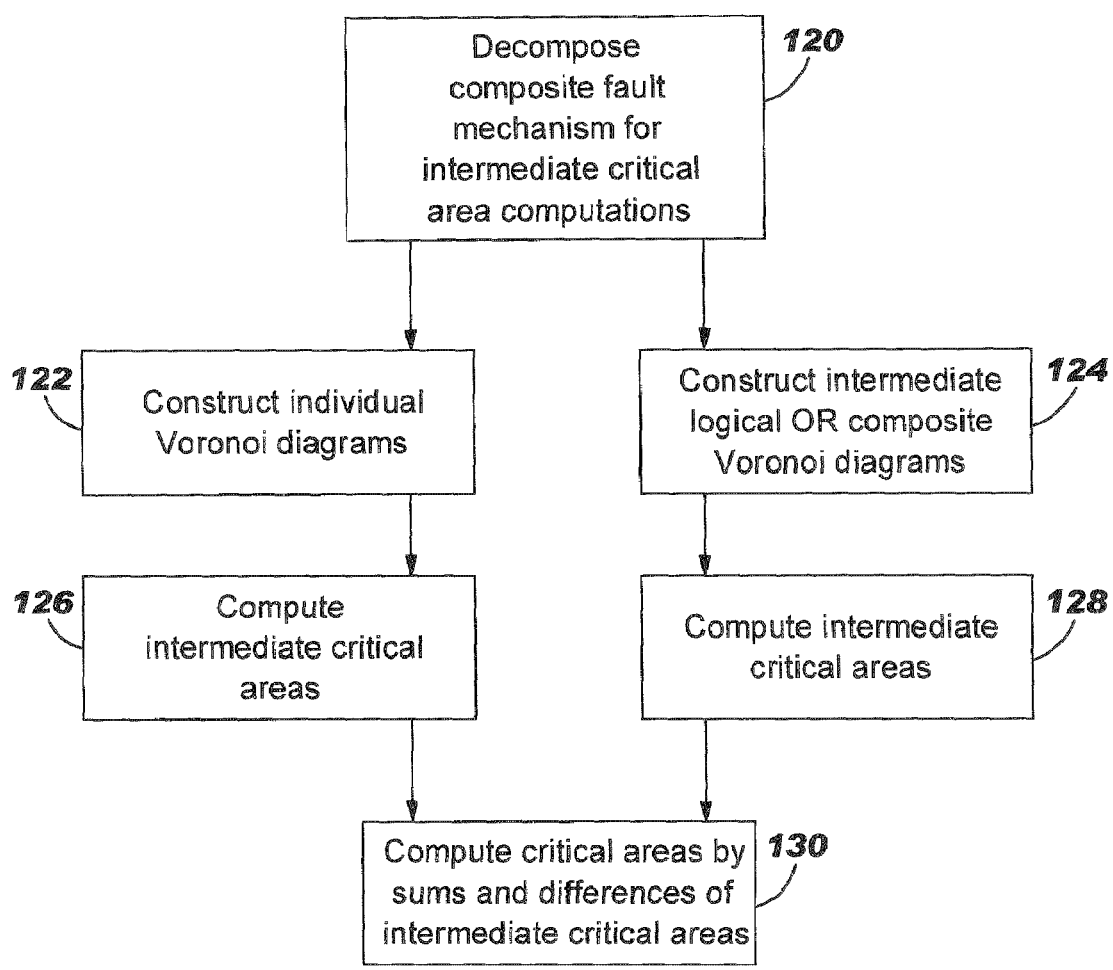
FIG. 10 is a flow diagram illustrating a preferred method of the invention.

More specifically, as shown in the flowchart in FIG. 10, the invention provides a method of determining critical areas associated with the composites of independent fault mechanisms though intermediate composite—OR Voronoi diagrams. Item 120 shows the decomposing composite fault mechanism for intermediate critical area computations. Item 122 in FIG. 10 constructs individual Voronoi diagrams. Item 124 constructs intermediate logical OR composite Voronoi diagrams. Items 126 and 128 compute intermediate critical areas. Item 130 computes critical areas by sums and differences of intermediate critical areas. This is of interest since composite-OR Voronoi diagrams can be constructed efficiently. This method is described by the following.

Let A and B be two independent random-defect fault mechanisms. Then,

CriticalArea(NOT A)=AreaOfLayout−CriticalArea(A)

CriticalArea(A AND B)=CriticalArea(A)+CriticalArea(B)−CriticalArea(A OR B)

CriticalArea(A AND NOT B)=CriticalArea(A OR B)−CriticalArea(B)

CriticalArea(A OR NOT B)=AreaOfLayout+CriticalArea(A)−CriticalArea(A OR B)

CriticalArea(A XOR B)=2CriticalArea(A OR B)−CriticalArea(A)−CriticalArea(B)

In general, given a composite mechanism y defined by a boolean expression over a set of independent random-defect fault mechanisms, one can compute CriticalArea (y) using the following algorithms.

I. Put the boolean expression which defines y into the following disjunctive normal form $$y=V_{M\in K}((\Lambda_{x\in A(M)}x) \wedge (\Lambda_{x\in B(M)}\bar{x})); A(M)\cap B(M)=\emptyset$$

Let x be an individual fault mechanism.
Let K be the set of all conjunction clusters in the boolean expression.
Let M be a conjunction cluster in K, consisting of a set of literals.
Let A(M) be the set of all variables in M that are non-negated literals.
Let B(M) be the set of all variables in M that are negated literals.
Let P(M) be the power set of M. Then $$CriticalArea(y)=\Sigma_{N\in P(K)}\Sigma_{M\in P(A(N))}(-1)^{(\|M\|-1)\times(\|N\|-1)}$$
$$CriticalArea(V_{x\in M\cup B(N)}x)$$

For each disjunction cluster $V_{x\in M\cup B(N)}x$, construct Voronoi $(V_{x\in M\cup B(N)}x)$ and compute CriticalArea$(V_{x\in M\cup B(N)}x)$ to obtain, CriticalArea(y).

II. Alternatively, put the boolean expression which defines y into the following conjunctive normal form $$y=\Lambda_{M\in K}((V_{x\in A(M)}x) \vee (V_{x\in B(M)}\bar{x})); A(M)\cap B(M)=\emptyset$$

Let x be an individual fault mechanism.
Let K be the set of all disjunction clusters in the boolean expression.
Let M be a disjunction cluster in K, consisting of a set of literals.
Let A(M) be the set of all variables in M that are non-negated literals.
Let B(M) be the set of all variables in M that are negated literals.

$$CriticalArea(y)=AreaOfLayout-\Sigma_{N\in P(K)}\Sigma_{M\in P(B(N))}(-1)^{(\|M\|-1)(\|N\|-1)}CriticalArea(V_{x\in M\cup A(N)}x)$$

For each disjunction cluster $V_{x\in M\cup A(N)}x$, construct Voronoi $(V_{x\in M\cup A(N)}x)$ and compute CriticalArea$(V_{x\in M\cup A(N)}x)$ to obtain CriticalArea(y).

Figure 11:
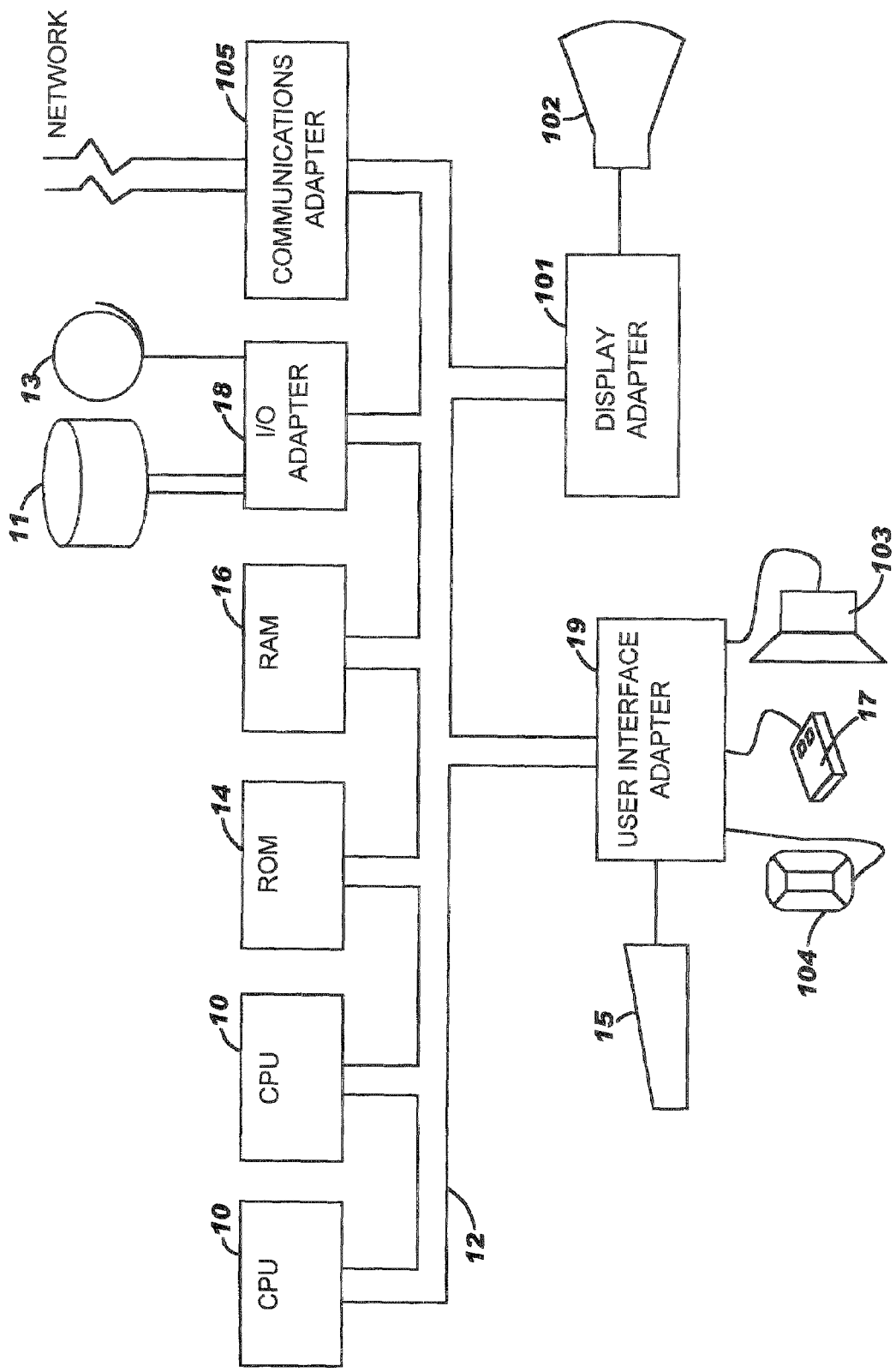
FIG. 11 is a schematic diagram of a hardware embodiment of the invention.

A representative hardware environment for practicing the present invention is depicted in FIG. 11, which illustrates a typical hardware configuration of an information handling/computer system in accordance with the subject invention, having at least one processor or central processing unit (CPU) 10. CPUs 10 are interconnected via system bus 12 to random access memory (RAM) 14, read-only memory (ROM) 16, an input/output (I/O) adapter 18 for connecting peripheral devices, such as disk units 11 and tape drives 13, to bus 12, user interface adapter 19 for connecting keyboard 15, mouse 17, speaker 103, microphone 104, and/or other user interface devices such as touch screen device (not shown) to bus 12, communication adapter 105 for connecting the information handling system to a data processing network, and display adapter 101 for connecting bus 12 to display device 102. A program storage device readable by the disk or tape units is used to load the instructions which operate the invention also loaded onto the computer system.

As we enable ourselves to build smaller and denser integrated circuits, their sensitivity to the occurrence of spot defects inherent in the manufacturing process becomes of greater importance. Such defects cause electrical faults within the circuit, contribute to yield loss, and ultimately result in lost resources. This invention addresses the problem by proving a measurement for this sensitivity for compound electrical fault mechanisms that can be efficiently and accurately obtained through critical area analysis based on Voronoi diagrams.

While the invention has been described in terms of preferred embodiments, those skilled in the art will recognize that the invention can be practiced with modification within the spirit and scope of the appended claims.

The invention claimed is:

1. A method of determining critical areas associated with different types of fault mechanisms in an integrated circuit design, said method comprising:
    constructing individual Voronoi diagrams for critical areas of individual fault mechanisms in said integrated circuit design, wherein said individual fault mechanisms comprise different types of fault mechanisms, wherein said individual fault mechanisms are independent from one another, and wherein each one of said individual fault mechanisms comprises a single fault mechanism;
    after said constructing of said individual Voronoi diagrams, constructing a composite Voronoi diagram based on at least two of said individual Voronoi diagrams; and
    computing a critical area for a composite fault mechanism of said integrated circuit design based on said composite Voronoi diagram such that said composite fault mechanism is dependent on at least two of said individual fault mechanisms.

2. The method according to claim 1, all the limitations of which are incorporated herein by reference, wherein said constructing of said composite Voronoi diagram comprises a mapping of minimum values of said at least two of said individual Voronoi diagrams.

3. The method according to claim 1, all the limitations of which are incorporated herein by reference, wherein said constructing of said composite Voronoi diagram comprises a mapping of maximum values of said at least two of said individual Voronoi diagrams.

4. The method according to claim 1, all the limitations of which are incorporated herein by reference, wherein said constructing of said composite Voronoi diagram comprises forming a logical OR composite of said at least two of said individual fault mechanisms.

5. The method according to claim 1, all the limitations of which are incorporated herein by reference, wherein said computing of said critical area for said composite fault mechanism comprises describing a Boolean expression over said at least two of said individual fault mechanisms.

6. The method according to claim 5, all the limitations of which are incorporated herein by reference, wherein said computing of said critical area for said composite fault mechanism further comprises:
    arranging said Boolean expression into disjunctive conjunctive form; and
    computing the sums and differences of component critical areas of logical OR composites of subsets of said at least two of said individual fault mechanisms.

7. The method according to claim 5, all the limitations of which are incorporated herein by reference, wherein said computing of said critical area for said composite fault mechanism further comprises:
    arranging said Boolean expression into conjunctive normal form;
    computing the sums and differences of component critical areas of logical OR composites of subsets of said at least two of said individual fault mechanisms to obtain an intermediate results; and
    subtracting said intermediate result from the area of said integrated circuit.

8. A method of determining critical areas associated with different types of fault mechanisms in an integrated circuit design, said method comprising:
    constructing individual Voronoi diagrams for critical areas of individual fault mechanisms in said integrated circuit design, wherein said individual fault mechanisms comprise different types of fault mechanisms, wherein said individual fault mechanisms are independent from one another, and wherein each one of said individual fault mechanisms comprises a single fault mechanism;
    after said constructing of said individual Voronoi diagrams, constructing a logical OR composite Voronoi diagram of at least two of said individual Voronoi diagrams; and
    computing a critical area for a composite fault mechanism of said integrated circuit design based on said logical OR composite Voronoi diagram such that said composite fault mechanism is dependent on at least two of said individual fault mechanisms.

9. The method according to claim 8, all the limitations of which are incorporated herein by reference, wherein said constructing of said logical OR composite Voronoi diagram comprises a mapping of minimum values of said at least two of said individual Voronoi diagrams.

10. The method storage device according to claim 8, all the limitations of which are incorporated herein by reference, wherein said computing of said critical area for said composite fault mechanism further comprises describing a Boolean expression over said at least two individual fault mechanisms.

11. The method according to claim 10, all the limitations of which are incorporated herein by reference, wherein said computing of said critical area for said composite fault mechanism further comprises:
    arranging said Boolean expression into conjunctive normal form;
    computing the sums and differences of component critical areas of logical OR composites of subsets of said at least two of said individual fault mechanisms to obtain an intermediate result; and
    subtracting said intermediate result from the area of said integrated circuit.

12. The method according to claim 10, all the limitations of which are incorporated herein by reference, wherein said computing of said critical area for said composite fault mechanism further comprises:
    arranging said Boolean expression into disjunctive normal form; and
    computing the sums and differences of component critical areas of logical OR composites of subsets of said at least two of said individual fault mechanisms.

13. The method according to claim 8, all the limitations of which are incorporated herein by reference, wherein said constructing of said logical OR composite Voronoi diagram comprises using a sweep-line algorithm.

* * * * *